United States Patent
Nickel

(10) Patent No.: US 11,848,513 B2
(45) Date of Patent: Dec. 19, 2023

(54) PUMP UNIT COMPRISING A CONNECTOR WITH PRESSURE COMPENSATION ELEMENT

(71) Applicant: NIDEC GPM GmbH, Auengrund OT Merbelsrod (DE)

(72) Inventor: Conrad Nickel, Troistedt (DE)

(73) Assignee: NIDEC GPM GmbH, Auengrund OT Merbelsrod (DE)

( * ) Notice: Subject to any disclaimer, the term of this patent is extended or adjusted under 35 U.S.C. 154(b) by 311 days.

(21) Appl. No.: 17/419,825

(22) PCT Filed: Feb. 20, 2020

(86) PCT No.: PCT/EP2020/054472
§ 371 (c)(1),
(2) Date: Jun. 30, 2021

(87) PCT Pub. No.: WO2020/173800
PCT Pub. Date: Sep. 3, 2020

(65) Prior Publication Data
US 2022/0085545 A1 Mar. 17, 2022

(30) Foreign Application Priority Data
Feb. 25, 2019 (DE) .......................... 102019104727.7

(51) Int. Cl.
*H01R 13/52* (2006.01)
*F04B 17/03* (2006.01)
(Continued)

(52) U.S. Cl.
CPC ......... *H01R 13/5202* (2013.01); *F04B 17/03* (2013.01); *H05K 5/0069* (2013.01); *H02K 7/14* (2013.01)

(58) Field of Classification Search
CPC .... H05K 5/0213; H05K 5/0069; F04B 17/03; H01R 13/5202
See application file for complete search history.

(56) References Cited

U.S. PATENT DOCUMENTS

| 5,422,791 A | 6/1995 | Bentz et al. |
| 2013/0109209 A1 | 5/2013 | Wiessneth |

(Continued)

FOREIGN PATENT DOCUMENTS

| DE | 41 40 487 A1 | 6/1993 |
| DE | 10 2010 042 254 A1 | 1/2012 |

(Continued)

OTHER PUBLICATIONS

Official Communication issued in International Patent Application No. PCT/EP2020/054472, dated May 29, 2020.

(Continued)

*Primary Examiner* — Jean F Duverne
(74) *Attorney, Agent, or Firm* — Keating & Bennett, LLP

(57) ABSTRACT

A pump assembly includes an electric motor with a printed circuit board carrying a controller, a pump driven by the electric motor, a housing surrounding the printed circuit board, and a connector attached on the outside of the housing by a flange. The connector covers an opening of the housing and includes contacts for direct electrical contact with the printed circuit board which passes through the opening of the housing. The connector includes a pressure compensator in the flange.

7 Claims, 7 Drawing Sheets

(51) Int. Cl.
*H05K 5/00* (2006.01)
*H02K 7/14* (2006.01)

(56) References Cited

U.S. PATENT DOCUMENTS

| | | | |
|---|---|---|---|
| 2014/0057545 A1* | 2/2014 | Rathke | H05K 5/0056 |
| | | | 454/184 |
| 2015/0208525 A1 | 7/2015 | Negishi et al. | |
| 2015/0331087 A1 | 11/2015 | Philipp et al. | |
| 2016/0157390 A1 | 6/2016 | Yang et al. | |

FOREIGN PATENT DOCUMENTS

| | | |
|---|---|---|
| DE | 11 2013 004 771 T5 | 6/2015 |
| DE | 10 2014 106 840 A1 | 11/2015 |
| DE | 10 2015 223 596 A1 | 6/2016 |
| DE | 10 2017 208 590 A1 | 11/2018 |
| DE | 10 2018 103 747 A1 | 8/2019 |
| JP | 60-128919 * | 7/1985 |

OTHER PUBLICATIONS

Official Communication issued in International Patent Application No. PCT/EP2020/054472, dated Aug. 25, 2021.
English translation of Official Communication issued in International Patent Application No. PCT/EP2020/054472, dated May 29, 2020.

* cited by examiner

PUMP UNIT COMPRISING A CONNECTOR WITH PRESSURE COMPENSATION ELEMENT

CROSS REFERENCE TO RELATED APPLICATIONS

This is a U.S. national stage of PCT Application No. PCT/EP2020/054472, filed on Feb. 20, 2020, and with priority under 35 U.S.C. § 119(a) and 35 U.S.C. § 365(b) being claimed from German Application No. 102019104727.7, filed Feb. 25, 2019; the entire disclosures of each application are hereby incorporated herein by reference.

1. FIELD OF THE INVENTION

The present invention relates to a pump assembly.

2. BACKGROUND

Water pumps often feature DC motors. The DC motors comprise a rotor connected to a motor shaft and rotatably mounted in a housing. The rotor is provided with permanent magnets. A stator is arranged in the rotor, which carries a number of windings on an iron core. When suitably controlled, the windings generate a magnetic field that drives the rotor to rotate. The windings are usually wound in three phases and are accordingly provided with three electrical connections via which the windings can be connected to a controller, such as an electronic control unit (ECU). These controllers are used in particular in the engine compartment, where they are exposed to considerable temperature fluctuations that can lead to major pressure fluctuations inside the housing. To compensate for these pressure fluctuations, semipermeable diaphragms are known from the prior art, which allow air and also water vapor to pass through the diaphragm to the outside and inside via a vent opening, but not water in liquid form. In the case of water pumps used in the engine compartments of road vehicles, there is also a requirement to protect the pumps from steam pressure generated by steam pressure cleaners.

SUMMARY

Example embodiments of the present disclosure provide pump assemblies each including a plug connector that is as simple as possible and a venting element that is as simple as possible.

A pump assembly according to an example embodiment of the present disclosure includes an electric motor with a printed circuit board carrying a controller, a pump driven by the electric motor, a housing surrounding the printed circuit board, and a plug connector which is fastened on an outside of the housing, in particular on the housing cover, by a flange which covers an opening of the housing, in particular of the housing cover, and which includes contacts which directly electrically contact the printed circuit board which passes through the opening of the housing. The plug connector includes a pressure compensator in the flange. By integrating the pressure compensator into the connector, the manufacturing process of an example embodiment of the present disclosure is able to be significantly simplified. The connector preferably includes a connection area for a connector plug located outside the housing.

Preferably, a pressure compensator according to an example embodiment of the present disclosure includes a water-impermeable membrane inserted into an opening passing through the flange.

In an advantageous example embodiment, the connector includes a base housing in which the contacts extend and which adjoins the flange, the opening being outside the connection of the flange to the base housing. It is preferred if the base housing is angled, in particular cranked, and an end region of the base housing remote from the flange, in particular the cranking, is located above the opening of the flange. The base housing itself thus protects the opening from water and dust penetration and from damage to the diaphragm.

Preferably, the membrane is connected to the connector by ultrasonic welding, laser beam welding or adhesive bonding.

It is advantageous if the pressure compensator, in particular, the diaphragm, is at least partially covered by a protective structure on the side remote from the housing. This protective structure protects the membrane from damage by water vapor. The protective structure may, for example, include a box above the opening of the flange and including openings in the sides and/or bottom to vent the housing.

However, the protective structure may also include a pot-shaped cover that includes openings in the rim to vent the housing.

Preferably, the protective structure is associated with the plug connector. In particular, the plug connector preferably is provided as a single monolithic member together with the protective structure, preferably by injection molding.

The housing is a metal housing. The housing is preferably the pump and/or motor housing. The pump assembly is preferably a water pump assembly or water pump used in a motor vehicle.

The above and other elements, features, steps, characteristics and advantages of the present disclosure will become more apparent from the following detailed description of the example embodiments with reference to the attached drawings.

BRIEF DESCRIPTION OF THE DRAWINGS

Example embodiments of the present disclosure are explained in more detail below with reference to the drawings. Similar or similarly acting components are designated in the figures with the same reference signs.

DETAILED DESCRIPTION

Figure 1:
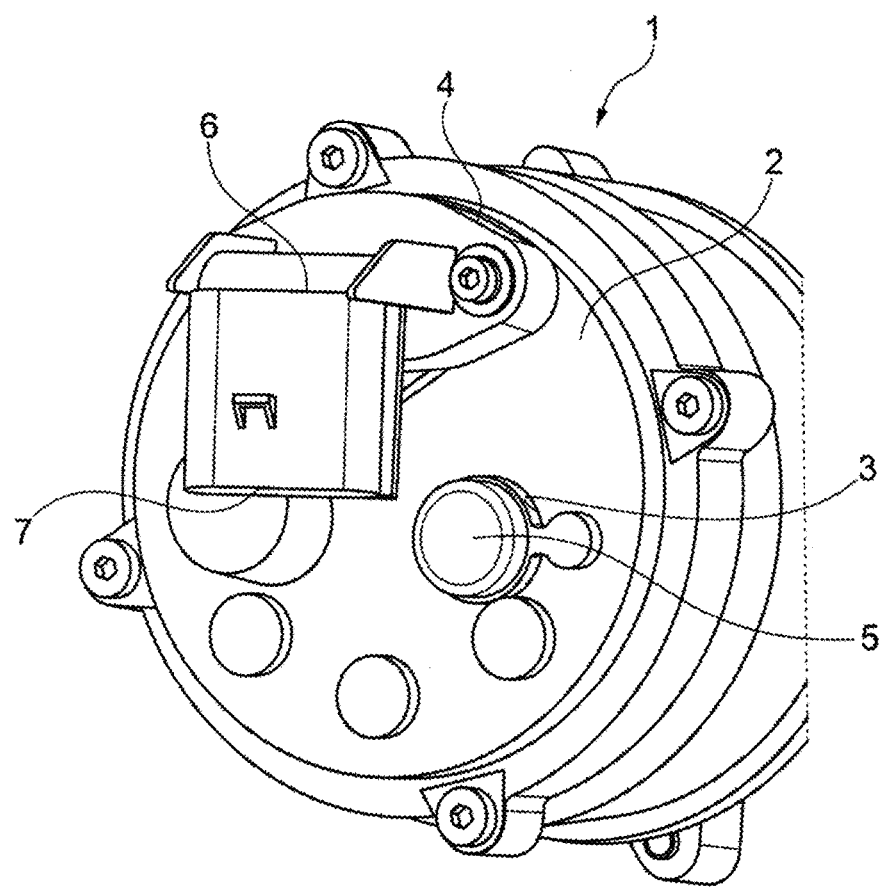
FIG. 1 is top view of a conventional water pump with plug connector and pressure compensation element.

FIG. 1 shows a prior art water pump assembly 1 with a housing 2. An electric motor, a printed circuit board carrying a controller and a pump are arranged inside the housing 2. The housing cover of the housing 2 has two openings 3, 4 on the end face near the circuit board. A diaphragm with clip is inserted into a first opening 3 to form a pressure compensation element 5. The second opening 4 is closed by a plug connector 6. The plug connector 6 directly contacts with its contacts the printed circuit board located inside the housing 2. For connection of the controller, the plug connector 6 has a connection area 7 for a connector plug not shown, which is located outside the housing 2.

FIGS. 2 to 7 show example embodiments of a plug connector 6 according to the present disclosure, which, as previously described, makes electrical contact with the printed circuit board of a pump and has a connection area 7 outside the housing for a connector plug. The plug connector 6 has a cylindrical and rectangular, cranked base housing 8. Contacts 9 extend in the base housing 8. The contacts 9 represent a conductive structure, which is preferably made of sheet copper by stamping. The contacts 9 are bent by about 90° and run in an end region remote from the pump housing, radially outwards, parallel to the surface of the housing 2. A flange 10 for fastening the plug connector 6 to the housing cover of the housing 2 adjoins the basic housing 8 on the side near the housing. The base housing 8 sits with its end region near the housing approximately vertically on the flange 10. The flange 10 has a closed groove 11 on its underside for insertion of a seal. Contact ends 12 project from the underside for direct electrical contact with the printed circuit board including the controller. The contact ends 12 are bulbously shaped pins. In particular, they are designed as press-fit pins for press-fit contacting. The end region of the base housing 8 remote from the housing is designed as a connection region 7 for a connector plug. Outside the connection to the basic housing 8, the flange 10 has an opening 13 passing through it. This recess 13 is closed by a water-impermeable membrane 14 for pressure compensation. The membrane 14 is connected to the connector 6 or the opening 13 by ultrasonic welding, laser beam welding or adhesive bonding. The membrane 14 is at least partially covered by a protective structure 15 on the side remote from the housing. This protective structure 15 serves to protect the membrane 14 from vapor pressure. By integrating the pressure compensation element into the plug connector 6, possible leakage points are reduced, and costs are also reduced because there are fewer sealing points. In addition, the installation position of the pump assembly can be selected as desired, since the pressure compensation element is surrounded by a suitable protective structure 15. The plug connector 6 is preferably manufactured in a single injection-molded part. The contacts 9 are overmolded with plastic during manufacture and thus have an integrated design. The housing of the pump assembly is preferably a metal housing. The housing can be the pump housing and/or the motor housing.

The individual example embodiments are described in detail below.

Figure 2:
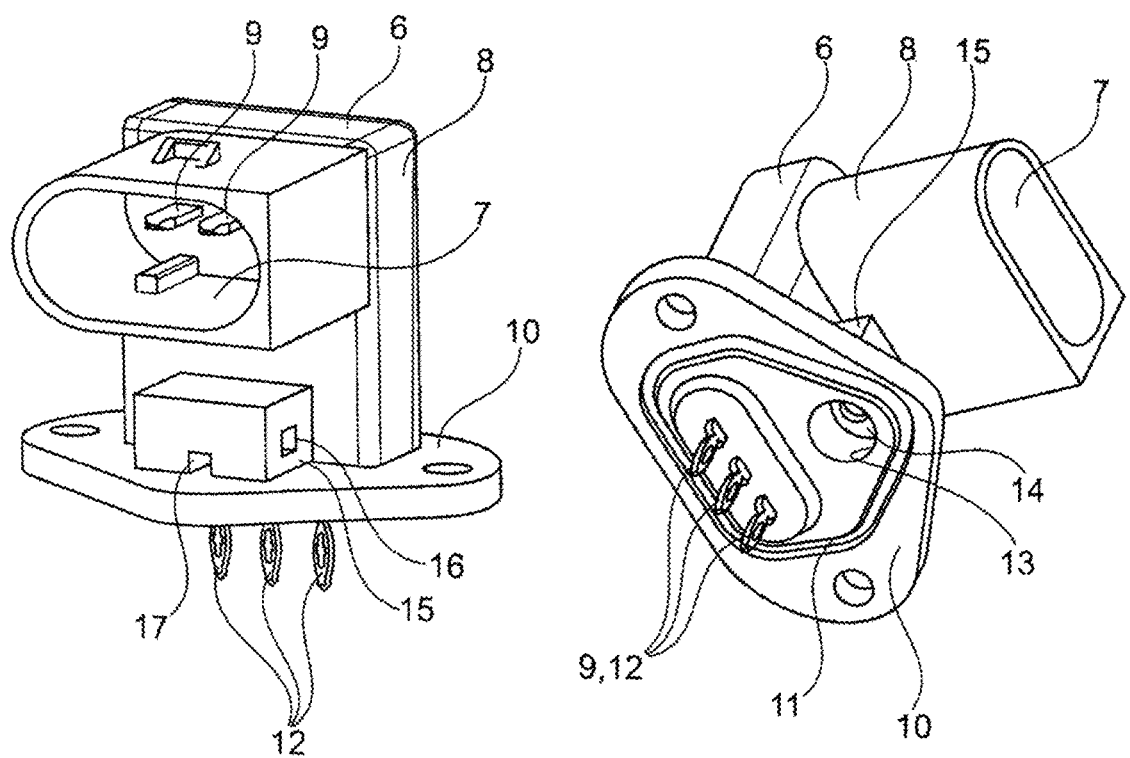
FIG. 2 include two spatial views of a plug connector according to an example embodiment of the present disclosure.
Figure 3:
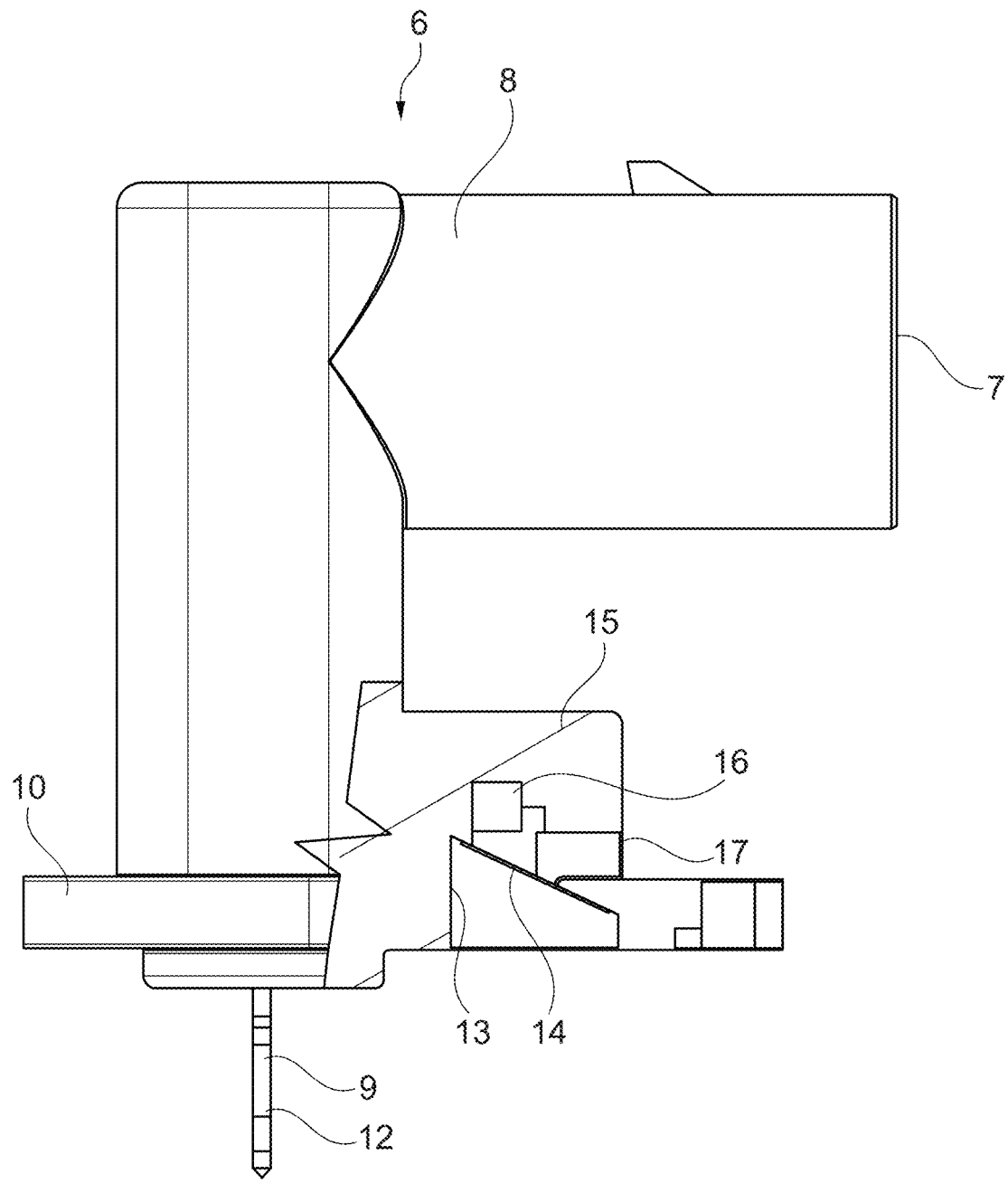
FIG. 3 is a longitudinal sectional view through the connector of FIG. 2.

FIGS. 2 and 3 show a first example embodiment. The pressure compensation element or opening 13 is arranged below the end region of the base housing 8 remote from the housing. The membrane 14 is covered by a rectangular box 15 for protection against steam pressure. The diaphragm 14 is preferably, as shown, arranged at an angle to the walls of the box to prevent water standing on the diaphragm in any installation position. The bottom 18 of the box is thereby arranged at a distance to the surface of the flange 10. The cover of the box 15 is thus formed by the flange 10 itself. The box 15 directly adjoins the base housing 8, so that the wall of the base housing forms a longitudinal side. The connector 6 is formed in one piece with the protective structure by injection molding. The box has opening 16 arranged centrally in its transverse sides perpendicular to the outer side of the basic housing. A further opening 17 is provided on the long side remote from the base housing. The openings 16, 17 provide ventilation for the housing and allow water which has penetrated the protective structure 15 to drain off.

Figure 4:
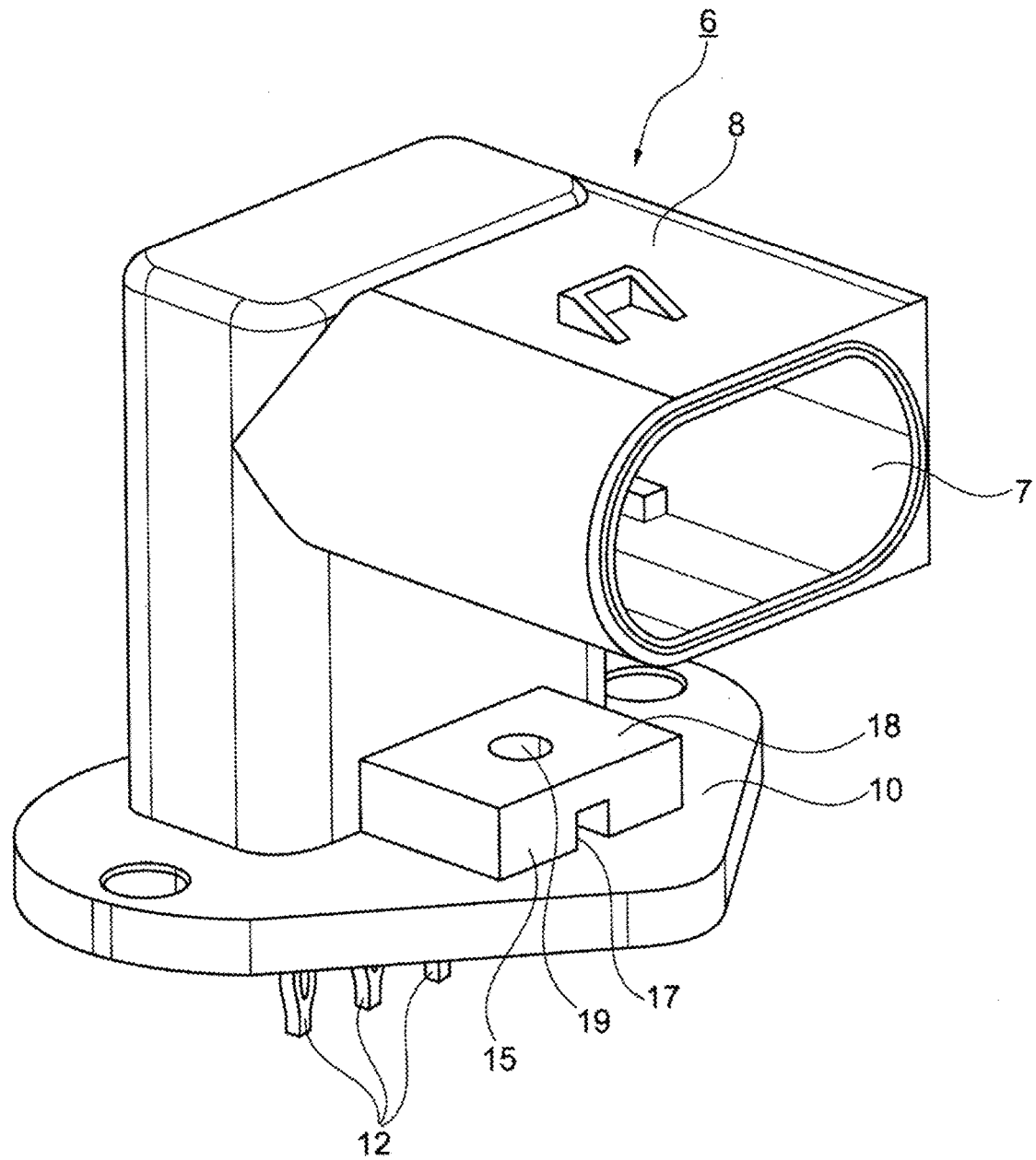
FIG. 4 is a spatial view of a second connector according to an example embodiment of the present disclosure.
Figure 5:
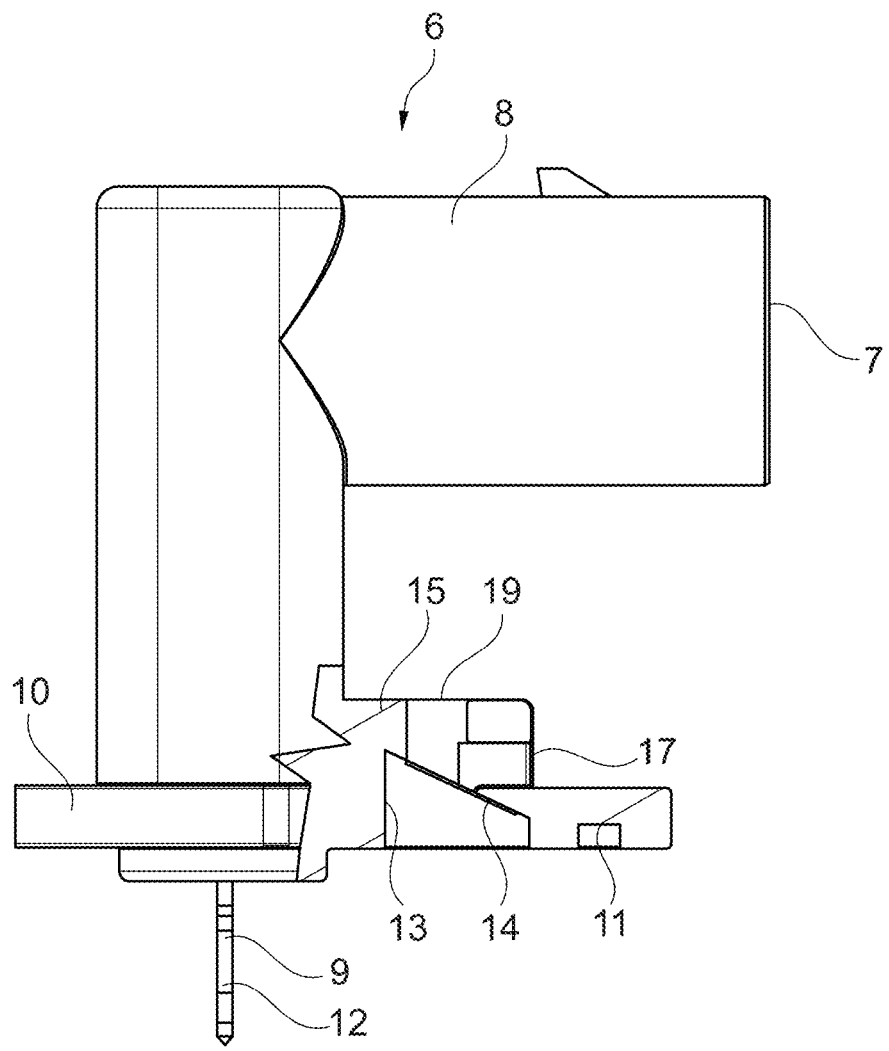
FIG. 5 is a longitudinal sectional view through the connector of FIG. 4.

Another example embodiment is shown in FIGS. 4 and 5. The plug connector 6 shown is essentially the same as previously described, except for the openings in the box of the protective structure 15. The box 15 has a central circular opening 19 in its base 18. Another opening 17 is provided on the long side remote from the base housing. This arrangement of the openings 17, 19 ensures that water which has penetrated the protective structure drains off in any installation position.

Figure 6:
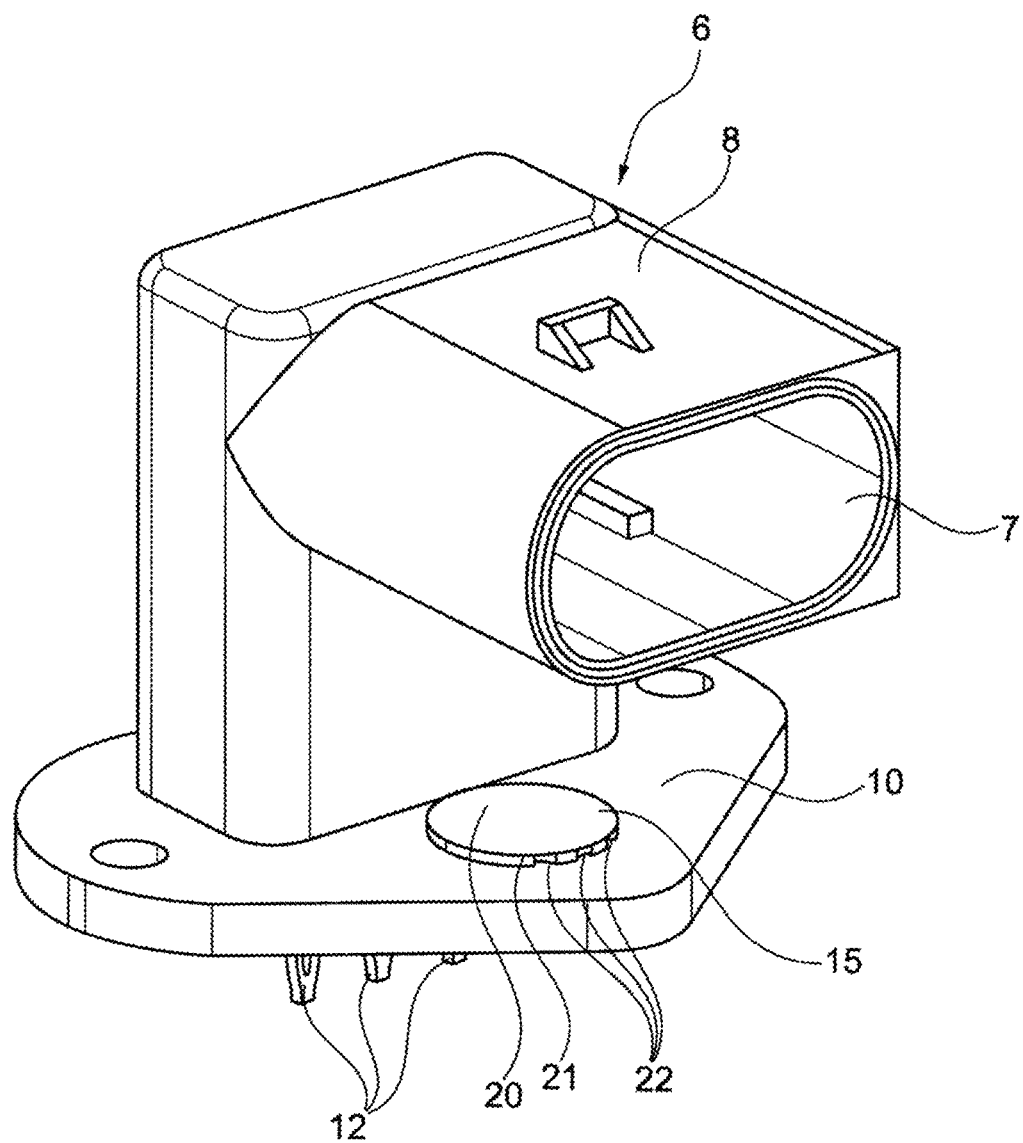
FIG. 6 is a spatial view of another connector according to an example embodiment of the present disclosure.
Figure 7:
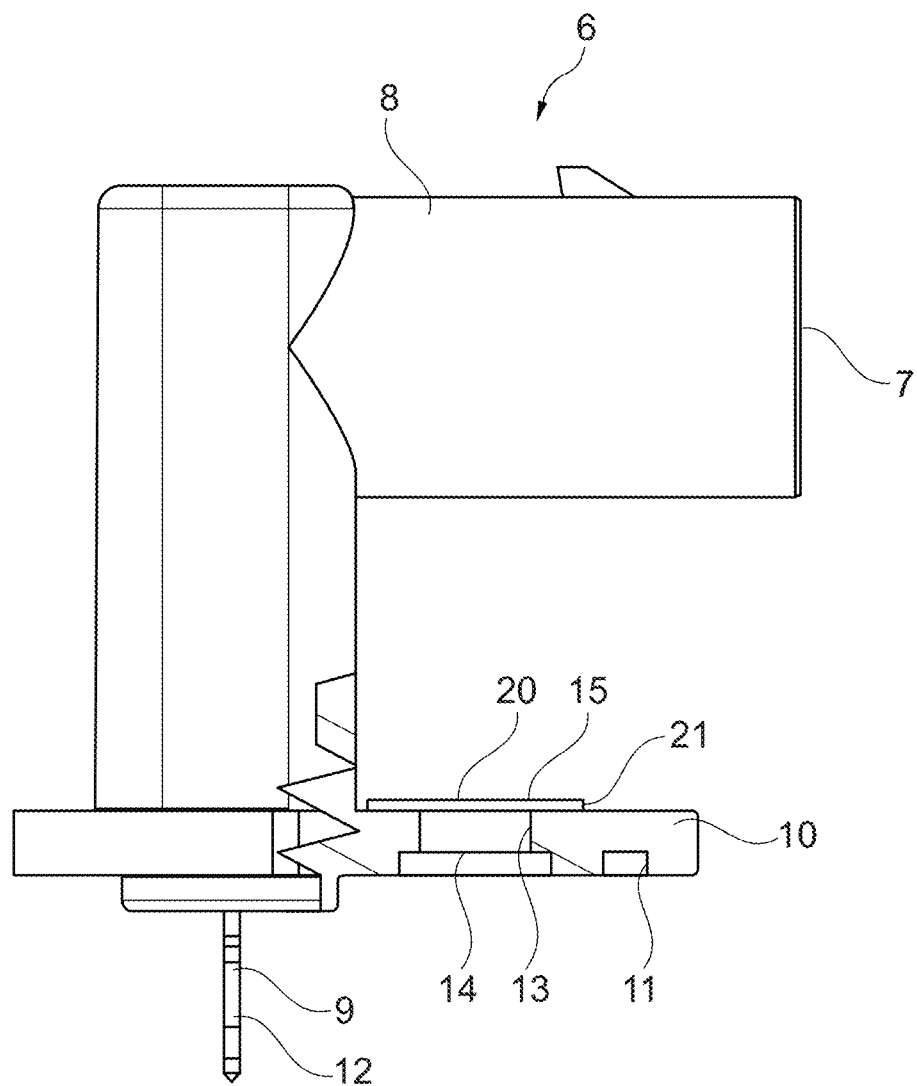
FIG. 7 is a longitudinal section through the connector of FIG. 6.

A third example embodiment is shown in FIGS. 6 and 7. The protective structure 15 comprises a pot-shaped cover with a circular base 20. The base 20 is spaced from the surface of the flange 10 and covers the opening 13 in the flange 10. The edge 21 of the cover stands on the surface of the flange 10 and has a plurality of openings 22 through which venting of the pressure compensation element arranged under the cover 15 takes place. The edge 21 of the cover has a low height. The cover 15 is a prefabricated element and is preferably glued or clipped in place.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

The invention claimed is:

1. A pump assembly, comprising:
an electric motor with a printed circuit board supporting a controller;
a pump driven by the electric motor;
a housing surrounding the printed circuit board; and
a plug connector which is fastened on an outside of the housing by a flange which covers an opening of the housing; wherein
the plug connector includes contacts which directly electrically contact the printed circuit board which passes through the opening of the housing;
the plug connector includes a pressure compensator in the flange;
a diaphragm is connected to the plug connector;
the diaphragm is connected to the plug connector through ultrasonic welding, laser beam welding, or adhesive bonding;
the diaphragm is at least partially covered by a protective structure on a side spaced away from the housing; and
the plug connector is embedded in the protective structure by injection molding.

2. The pump assembly according to claim 1, wherein the pressure compensator includes a water-impermeable membrane inserted into an additional opening which passes through the flange.

3. The pump assembly according to claim 2, wherein the plug connector includes a base housing in which the contacts are provided and which adjoins the flange, the additional opening being outside a location where the flange is connected to the base housing.

4. The pump assembly according to claim 2, wherein the base housing is angled and an end region of the base housing located away from the flange is above the additional opening.

5. The pump assembly according to claim 1, wherein the protective structure is defined by a box including openings to vent the housing.

6. The pump assembly according to claim 1, wherein the protective structure is defined by a pot-shaped cover including openings in its edge to vent the housing.

7. The pump assembly according to claim 1, wherein the housing is a metal housing.

\* \* \* \* \*